United States Patent
Locatelli et al.

(10) Patent No.: US 12,388,440 B2
(45) Date of Patent: Aug. 12, 2025

(54) GATE DRIVER

(71) Applicant: Infineon Technologies Austria AG, Villach (AT)

(72) Inventors: Christian Locatelli, Pavia (IT); Martina Arosio, Brugherio (IT); Weidong Chu, San Pedro, CA (US)

(73) Assignee: INFINEON TECHNOLOGIES AUSTRIA AG, Villach (AT)

(*) Notice: Subject to any disclaimer, the term of this patent is extended or adjusted under 35 U.S.C. 154(b) by 55 days.

(21) Appl. No.: 18/398,870

(22) Filed: Dec. 28, 2023

(65) Prior Publication Data

US 2025/0219635 A1  Jul. 3, 2025

(51) Int. Cl.
*H03K 17/30* (2006.01)
*H03K 17/687* (2006.01)

(52) U.S. Cl.
CPC ......... *H03K 17/302* (2013.01); *H03K 17/687* (2013.01); *H03K 2217/0063* (2013.01); *H03K 2217/0072* (2013.01)

(58) Field of Classification Search
CPC .................................................. H03K 17/302

USPC ......................................................... 327/108
See application file for complete search history.

(56) References Cited

U.S. PATENT DOCUMENTS

| | | | |
|---|---|---|---|
| 10,461,730 B1 * | 10/2019 | Mariconti | H03K 17/168 |
| 10,587,262 B1 * | 3/2020 | Morini | H03K 17/04206 |
| 2025/0030335 A1 * | 1/2025 | Raffo | H02M 1/325 |

* cited by examiner

*Primary Examiner* — Tomi Skibinski
(74) *Attorney, Agent, or Firm* — Cooper Legal Group LLC

(57) ABSTRACT

A gate driver has a supply voltage terminal, a bootstrap terminal connected to the supply voltage terminal, a driver having a power input terminal connected to the bootstrap terminal and an output connected to a gate control signal output terminal and configured to generate a gate drive signal at the gate control signal output terminal based on a voltage on the power input terminal, a clamp driver connected to the bootstrap terminal, a clamp transistor connected between a clamp signal input terminal and a reference voltage terminal and having a gate connected to the clamp driver, and an energy harvesting circuit connected between the clamp signal input terminal and the gate of the clamp transistor.

20 Claims, 4 Drawing Sheets

GATE DRIVER

TECHNICAL FIELD

The present disclosure relates generally to electronic circuits, and, more particularly, to a gate driver that reduces feedthrough activations.

BACKGROUND

A power semiconductor device comprises a semiconductor structure configured to conduct a load current along a load current path between two load terminal structures of the device. The load current path may be controlled by a gate electrode of the power semiconductor device.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

According to some embodiments, a gate driver comprises a supply voltage terminal, a bootstrap terminal connected to the supply voltage terminal, a driver having a power input terminal connected to the bootstrap terminal and an output connected to a gate control signal output terminal and configured to generate a gate drive signal at the gate control signal output terminal based on a voltage on the power input terminal, a clamp driver connected to the bootstrap terminal, a clamp transistor connected between a clamp signal input terminal and a reference voltage terminal and having a gate connected to the clamp driver, and an energy harvesting circuit connected between the clamp signal input terminal and the gate of the clamp transistor.

According to some embodiments, a circuit comprises a supply voltage terminal, a bootstrap terminal connected to the supply voltage terminal, a bootstrap capacitor connected to the bootstrap terminal, a high side transistor, a low side transistor, a high side gate driver connected to the high side transistor and having a power input terminal connected to the bootstrap terminal, a low side gate driver connected to the low side transistor, a controller configured to generate a start-up pulse using the low side gate driver to charge the bootstrap capacitor, a clamp driver, a clamp transistor connected between a gate of the high side transistor and a reference voltage terminal and having a gate connected to the clamp driver, and an energy harvesting circuit connected between the gate of the high side transistor and the gate of the clamp transistor and configured to harvest energy from the gate of the high side transistor responsive to the start-up pulse and activate the clamp transistor using the harvested energy.

According to some embodiments, a system comprises means for generating a start-up pulse, means for harvesting energy injected on a clamp signal input terminal responsive to the start-up pulse, and means for activating a clamp transistor connected between the clamp signal input terminal and a reference voltage terminal using the harvested energy to provide a low impedance path from the clamp signal input terminal to the reference voltage terminal.

According to some embodiments, a method comprises generating a start-up pulse, harvesting energy injected on a clamp signal input terminal responsive to the start-up pulse, and activating a clamp transistor connected between the clamp signal input terminal and a reference voltage terminal using the harvested energy to provide a low impedance path from the clamp signal input terminal to the reference voltage terminal.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

Figure 1:
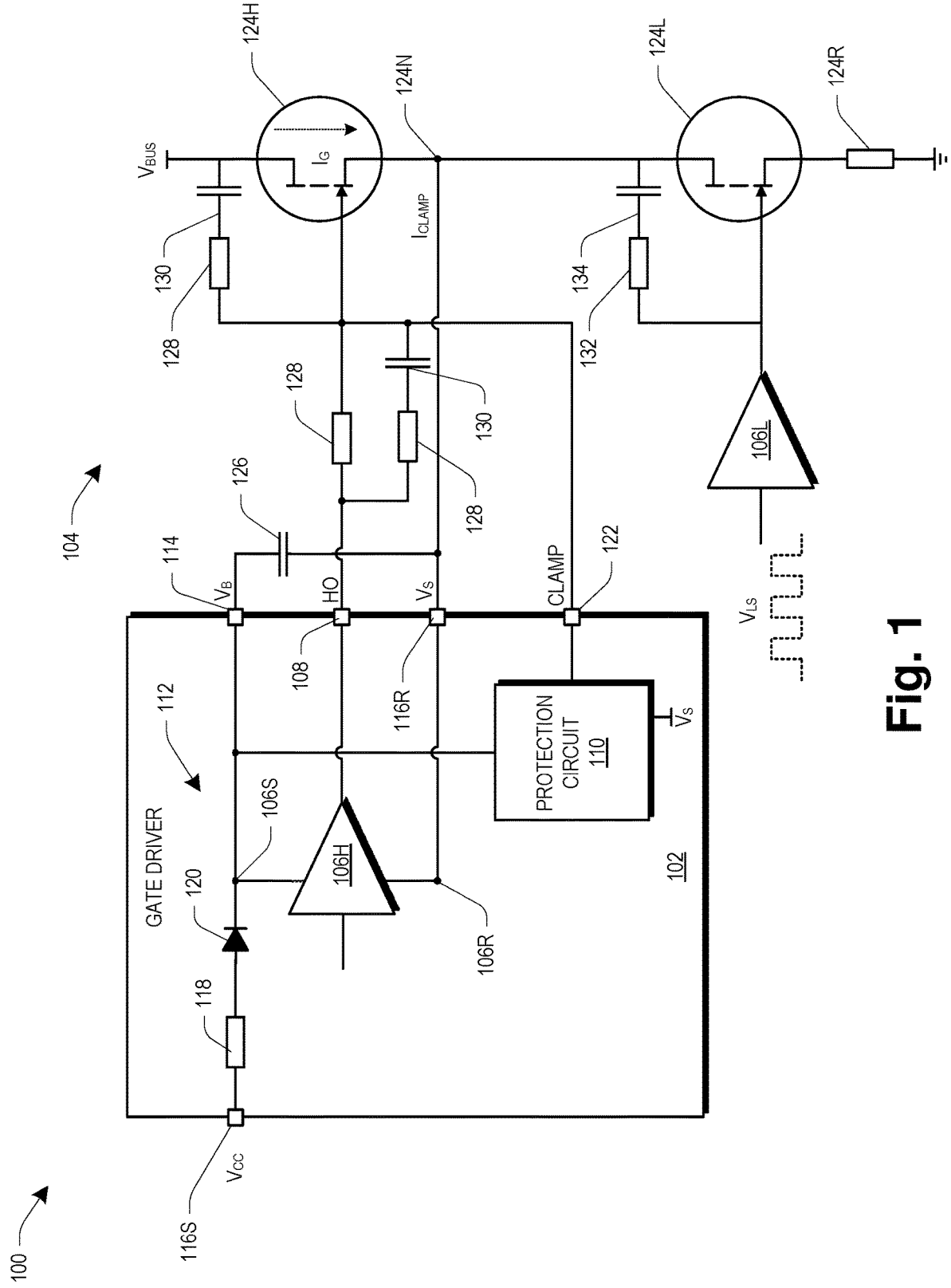
FIG. 1 is a schematic diagram of a circuit, such as to drive a load, according to some embodiments.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

Equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "above", "front", "behind", "back", "leading", "trailing", etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope defined by the claims. The following detailed description, therefore, is not to be taken in a limiting sense.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The term "substantially" may be used herein to account for small manufacturing tolerances (e.g., within 5%) that are deemed acceptable in the industry without departing from the aspects of the embodiments described herein.

Gate drivers are used to control power semiconductor devices to enable load current to be controlled. Example applications include motor controls, inverters, power supplies, voltage converters, or some other application. Low threshold voltage power semiconductor devices, such as gallium nitride (GaN) devices are susceptible to short through activations where a voltage on the source of the power semiconductor device causes the power semiconductor device to activate, an effect referred to as the Miller effect. A Miller clamp circuit may be provided to clamp the gate voltage of the power semiconductor device to a reference voltage corresponding to an off state, such as ground, to prevent spurious activations. To enable the Miller clamp circuit, a supply voltage is necessary to enable a clamp transistor to clamp the gate voltage. However, during a start-up cycle of a gate driver, a bootstrap technique may be used where the voltage, $V_{CC}$, provided to the gate driver integrated circuit is used to charge a bootstrap capacitor to generate the supply voltage. During the start-up cycle the supply voltage is insufficient to drive the Miller clamp circuit. For example, the power semiconductor devices may include a high side switch and a low side switch. The low side switch may be activated using a drive signal to charge the bootstrap capacitor. Since the Miller clamp circuit cannot be activated, the activations of the low side switch may generate a voltage on the gate of the high side switch sufficient to cause a spurious activation of the high side switch due to the Miller effect.

Referring to FIG. 1 a schematic diagram of a load driving circuit 100 is provided, according to some embodiments. The load driving circuit 100 comprises a gate driver 102 and a load driver 104. In some embodiments, the gate driver 102 comprises a high side driver 106H having an output connected to a gate control signal output terminal 108 for providing a gate drive signal (HO), a protection circuit 110, and a bootstrap circuit 112 configured to generate a bootstrap voltage ($V_B$) at a bootstrap output terminal 114 from a supply voltage ($V_{CC}$) provided at a supply voltage terminal 116S. In some embodiments, the bootstrap circuit 112 comprises a resistor 118 in series with a bootstrap diode 120 connected between the supply voltage terminal 116 and the bootstrap output terminal 114. The bootstrap output terminal 114 is connected to a power input terminal 106S of the high side driver 106H. The high side driver 106H generates the gate drive signal at the gate control signal output terminal 108 based on the voltage on the power input terminal 106S. A reference terminal 106R of the high side driver 106H is connected to a reference voltage terminal 116R. In some embodiments, the voltage at the reference voltage terminal 116R is ground. The protection circuit 110 is connected between the bootstrap output terminal 114 and a clamp signal input terminal 122 to protect elements of the load driver 104.

In some embodiments, the load driver 104 comprises a high side transistor 124H and a low side transistor 124L connected at a node 124N. A drain of the high side transistor 124H is connected to a bus voltage ($V_{BUS}$) and a source of the low side transistor 124L is connected to ground through a resistor 124R. The high side transistor 124H and the low side transistor 124L control power provided to a load connected to the load driver 104, such as a motor, a voltage bus, or some other load. The clamp signal input terminal 122 is connected to a gate of the high side transistor 124H. A bootstrap capacitor 126 is connected between the bootstrap output terminal 114 and the reference voltage terminal 116R for storing a bootstrap voltage for powering the high side driver 106H. Optional filter elements, such as resistors 128 and capacitors 130 may be provided between the gate control signal output terminal 108 and the gate of the high side transistor 124H or between the gate and the drain of the high side transistor 124H to affect the switching response of the high side transistor 124H. Optional filter elements, such as resistors 132 and capacitors 134 may be provided for the low side transistor 124L. For ease of illustration, the drive circuitry for the low side transistor 124L is represented by a low side driver 106L. The low side driver 106L may be provided in the gate driver 102 or a separate gate driver may be provided for driving the low side transistor 124L. Other structures and/or configurations of the load driver 104 are within the scope of the present disclosure.

During a start-up cycle, a series of start-up pulses is provided to the low side transistor 124L by the low side driver 106L, creating a path to charge the bootstrap capacitor 126 from the supply voltage terminal 116S. Until the bootstrap capacitor 126 is sufficiently charged insufficient voltage is present to activate the protection circuit 110 to shunt Miller current in the high side transistor 124H.

Figure 2:
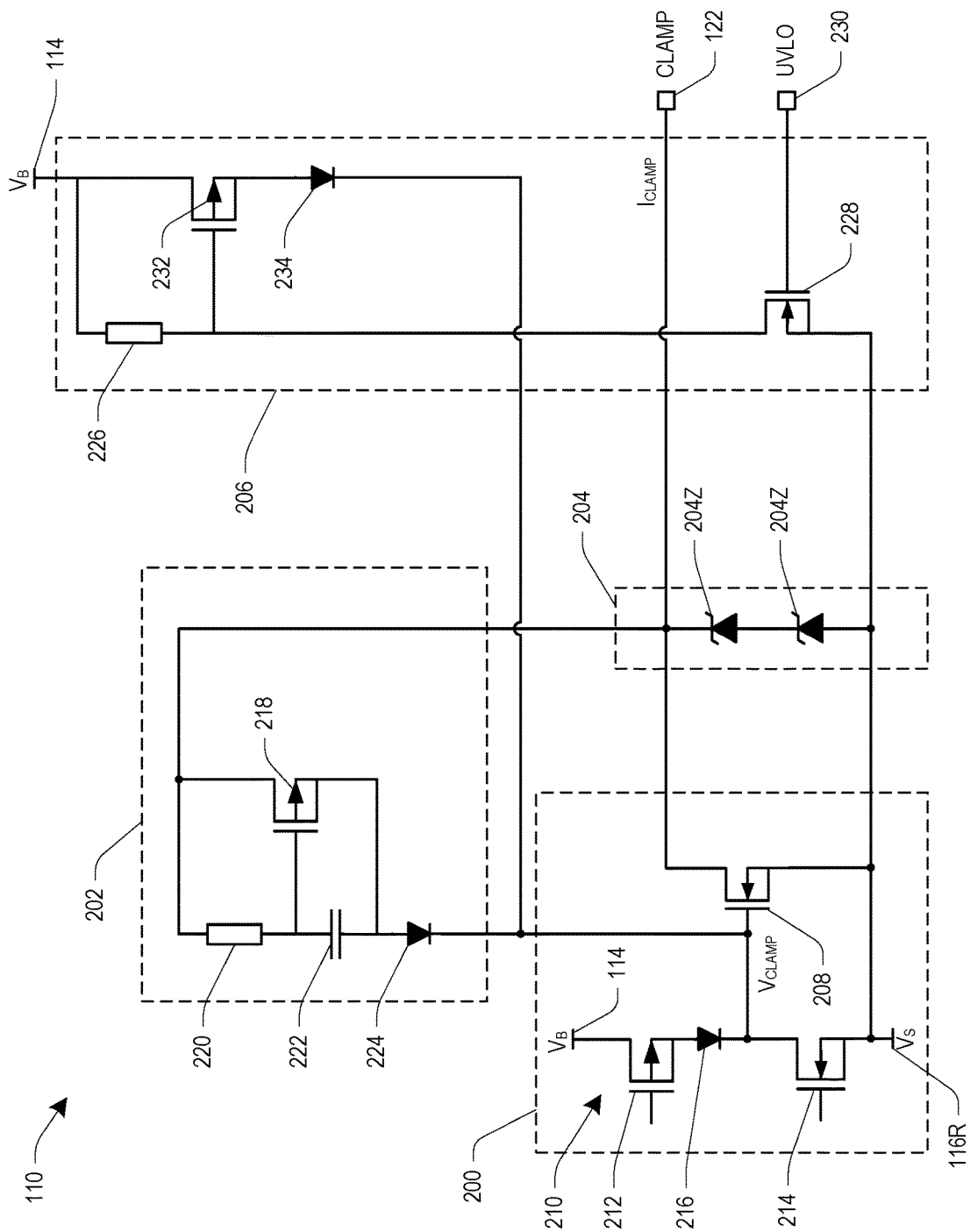
FIG. 2 is a diagram of a circuit, such as for protection, according to some embodiments.

FIG. 2 is a diagram of a protection circuit 110, according to some embodiments. In some embodiments, the protection circuit 110 comprises a clamp circuit 200, an energy harvesting circuit 202, an electrostatic discharge (ESD) circuit 204, and a start-up circuit 206. The clamp circuit 200 shunts the Miller current injected on the clamp signal input terminal 122 to the reference voltage terminal 116R. The energy harvesting circuit 202 harvests Miller current injected on the clamp signal input terminal 122 during a start-up period to enable the clamp circuit 200 until the bootstrap capacitor 126 is charged to enable normal operation of the clamp circuit 200. The ESD circuit 204 protects against an electrostatic voltage present on the clamp signal input terminal 122. The start-up circuit 206 provides an additional DC coupled path from the bootstrap output terminal 114 to the clamp circuit 200 to allow the clamp circuit 200 to fully operate at a minimum supply for the given technology node.

The clamp circuit 200 comprises a clamp transistor 208 (e.g., n-type) connected between the clamp signal input terminal 122 and the reference voltage terminal 116R, and a clamp driver 210. In some embodiments, the clamp driver 210 comprises a pull-up transistor 212 (e.g., p-type) connected to the bootstrap output terminal 114, a pull down transistor 214 (e.g., n-type) connected to the reference voltage terminal 116R, and a decoupling diode 216 connected between the pull-up transistor 212 and the pull down transistor 214. The decoupling diode 216 is connected to the gate of the clamp transistor 208. During normal operation, when the bootstrap voltage, VB, is present, the pull-up transistor 212 is activated by a voltage derived from $V_B$ to activate the clamp transistor 208. Other structures and/or configurations of the clamp circuit 200 are within the scope of the present disclosure.

The energy harvesting circuit 202 is connected between the clamp signal input terminal 122 and the gate of the clamp transistor 208. In some embodiments, the energy harvesting circuit 202 comprises a transistor 218 (e.g., p-type), a resistor 220 connected between a drain and a gate of the transistor 218, capacitor 222 connected between the gate and a source of the transistor 218, and a decoupling diode 224 connected to the gate of the transistor 218. The energy harvesting circuit 202 is an active AC clamp circuit that converts the AC Miller current on the clamp signal input terminal 122 resulting from start-up pulses used to charge the bootstrap capacitor 126 to activate the clamp transistor 208. Current on the clamp signal input terminal 122 charges the capacitor 222 to generate a DC signal for charging the gate of the clamp transistor 208. Other structures and/or configurations of the energy harvesting circuit 202 are within the scope of the present disclosure.

The ESD circuit 204 is connected between the clamp signal input terminal 122 and reference voltage terminal 116R. In some embodiments, the ESD circuit 204 comprises one or more Zener diodes 204Z. Other structures and/or configurations of the ESD circuit 204 are within the scope of the present disclosure.

The start-up circuit 206 is connected between the bootstrap output terminal 114 and gate of the clamp transistor 208. In some embodiments, the start-up circuit 206 comprises a resistor 226 connected to the bootstrap output terminal 114, a transistor 228 (e.g., n-type) connected between the resistor 226 and the reference voltage terminal 116R and having a gate connected to an undervoltage lockout (UVLO) terminal 230, a transistor 232 (e.g., p-type) having a drain connected to the bootstrap output terminal 114 and a gate connected to the resistor 226 and the transistor 228, and a decoupling diode 234 connected between a source of the transistor 232 and the gate of the clamp transistor 208. Other structures and/or configurations of the start-up circuit 206 are within the scope of the present disclosure.

During a start-up cycle, a series of start-up pulses, such as a pulse width modulation (PWM) signal, is provided to the low side transistor 124L by the low side driver 106L, creating a path to charge the bootstrap capacitor 126 from the supply voltage terminal 116S. Until the bootstrap capacitor 126 is sufficiently charged insufficient voltage is present to activate the clamp circuit 200 to shunt Miller current in the high side transistor 124H using the clamp driver 210. The Miller current (i.e., drain to gate current) is present on the clamp signal input terminal 122. The energy harvesting circuit 202 converts the AC Miller current to a DC voltage and stores (i.e., integrates) the DC voltage on a gate of the clamp transistor 208. This stored voltage activates the clamp transistor 208 and shunts any subsequent Miller current. The decoupling diodes 216, 224, 234 prevent decay of the voltage stored on the gate of the clamp transistor 208.

Figure 3:
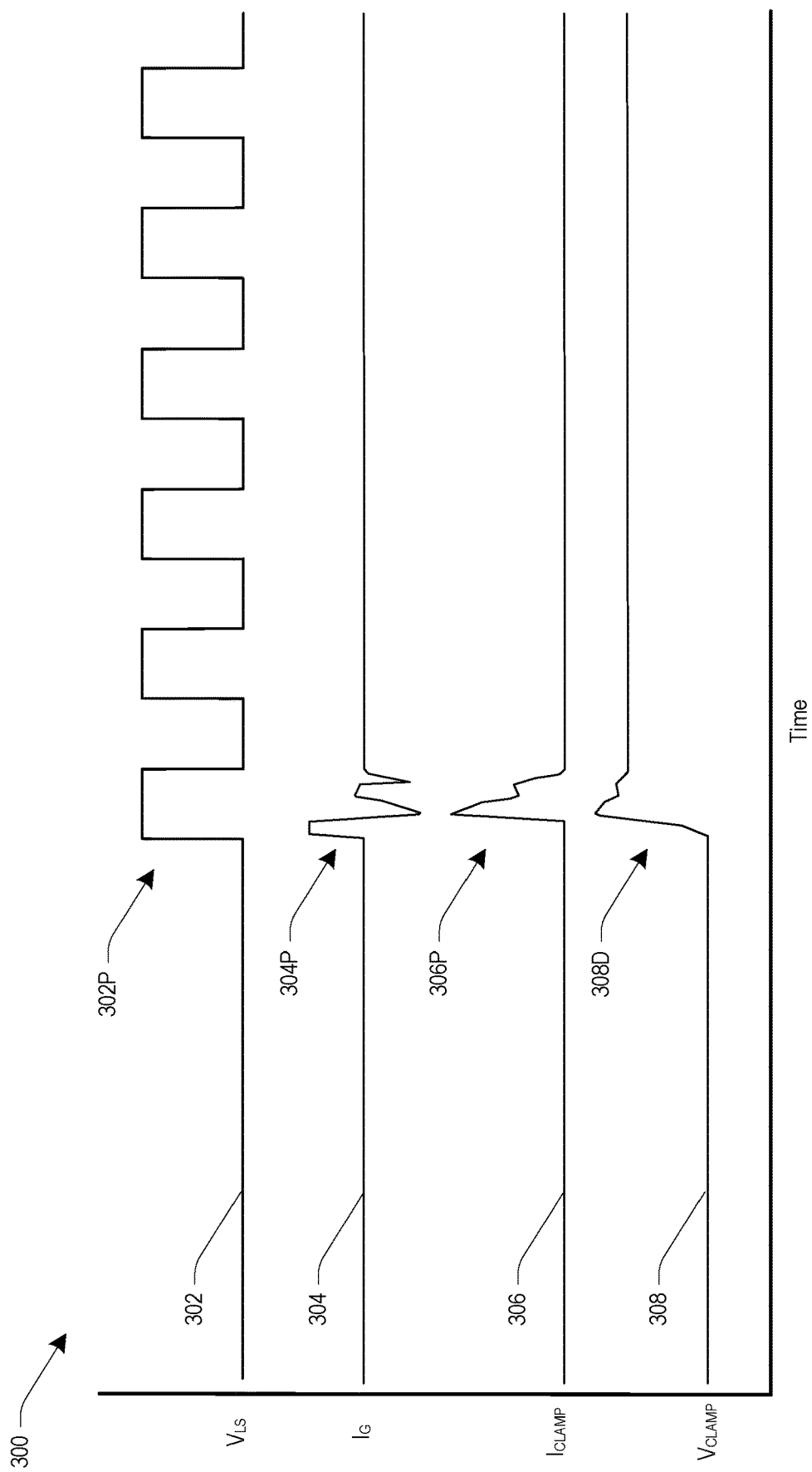
FIG. 3 is a signal diagram illustrating operation of a protection circuit, according to some embodiments.

FIG. 3 is a signal diagram 300 illustrating operation of the protection circuit 110, according to some embodiments. FIG. 3 includes a low side transistor drive signal 302 ($V_{LS}$), a drain to gate current signal 304 (IG) representing Miller current in the high side transistor 124H, a clamp current signal 306 ($I_{CLAMP}$) representing current on the clamp signal input terminal 122, and a clamp voltage signal 308 ($V_{CLAMP}$) representing voltage on the gate of the clamp transistor 208. Start-up pulses 302P in the low side transistor drive signal 302 provided by the low side driver 106L activate the low side transistor 124L to charge the bootstrap capacitor 126. Due to the Miller effect, the gate to source voltage across the high side transistor 124H from the first start-up pulse 302P in the low side transistor drive signal 302 induces an AC gate current pulse 304P in the high side transistor 124H as shown in the gate current signal 304. A corresponding current pulse 306P is seen in the clamp current signal 306 on the clamp signal input terminal 122. The energy harvesting circuit 202 converts the current pulse 306P to a DC voltage 308D on the gate of the clamp transistor 208 to enable the clamp transistor 208 and shunt the Miller current from subsequent start-up pulses 302P in the low side transistor drive signal 302. In some embodiments, the protection circuit 110 activates the clamp transistor 208 after one start-up pulse 302P in the low side transistor drive signal 302 and the corresponding Miller current pulse 304P.

Figure 4:
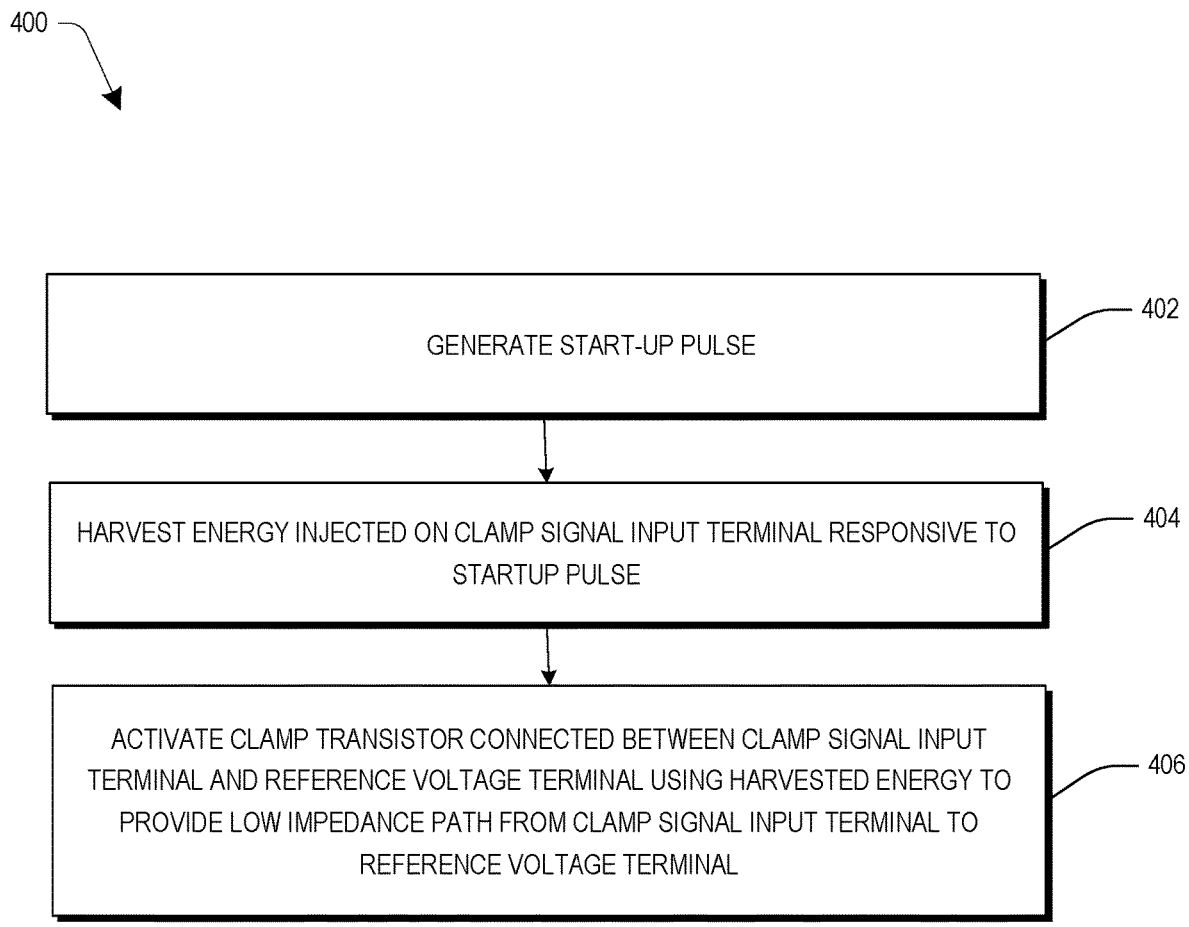
FIG. 4 illustrates a method of driving a gate, such as of a transistor, according to some embodiments.

FIG. 4 illustrates a method 400 of driving a transistor gate, according to some embodiments. At 402, a start-up pulse is generated. In some embodiments, the start-up pulse comprises a pulse 302P provided by the low side driver 106L in the low side transistor drive signal 302 to enable the low side transistor 124L to charge the bootstrap capacitor 126. At 404, energy injected on the clamp signal input terminal 122 responsive to the start-up pulse is harvested, for example, by the energy harvesting circuit 202. At 406, the clamp transistor 208 connected between the clamp signal input terminal 122 and the reference voltage terminal 116R is activated using the harvested energy to provide a low impedance path from the clamp signal input terminal 122 to the reference voltage terminal 116R.

The protection circuit 110 addresses start-up effects on low threshold voltage power transistor devices, such as GaN devices. Here, a low threshold voltage is, for example, a threshold voltage of about 2.5 V, about 2 V, about 1.5 V, or about or below 1 V. The threshold voltage of power transistor device may be a function of temperature and decrease with increasing temperature, and the given example values may relate to one of a typical operation temperature of the device in a specific application, a standard temperature used for testing the device, a maximum rated operating temperature of the device, or a typical ambient temperature. Here, a relevant temperature range may be from about 0° C. up to about 200° C. Spurious activations of the low threshold voltage power transistor devices can be suppressed by activating clamp circuitry using energy harvested from the Miller current induced during the start-up cycle. Shoot-through in the half bridge defined by the transistors 124H, 124L is also suppressed.

According to some embodiments, the protection circuit may suppress spurious activations of power transistor devices in cases when the power transistor threshold voltage has a value that is lower than or is on the order of the gate driver logic minimum operating voltage (e.g., the power transistor threshold voltage is within a range of 50% of the gate driver logic minimum operating voltage), and/or when the power transistor threshold voltage has a value that is lower than or that is on the order of an activation voltage to activate the clamp transistor (e.g., the power transistor threshold voltage is within a range of 50% of the activation voltage of the clamp transistor). For example, the gate driver logic minimum operation voltage may be about 1.5 V, and the power transistor threshold voltage may be below 1.5 V, or may be in a range of up to about 2.3 V. As another example, the activation voltage of the clamp transistor may be about 1.2 V, and the power transistor threshold voltage may be below 1.2 V or in a range of up to about 2 V. These voltages are only example values that are not to be construed as limiting.

According to some embodiments, a gate driver comprises a supply voltage terminal, a bootstrap terminal connected to the supply voltage terminal, a driver having a power input terminal connected to the bootstrap terminal and an output connected to a gate control signal output terminal and configured to generate a gate drive signal at the gate control signal output terminal based on a voltage on the power input terminal, a clamp driver connected to the bootstrap terminal, a clamp transistor connected between a clamp signal input terminal and a reference voltage terminal and having a gate connected to the clamp driver, and an energy harvesting circuit connected between the clamp signal input terminal and the gate of the clamp transistor.

According to some embodiments, the energy harvesting circuit comprises an active alternating current clamp connected to the clamp signal input terminal, and a decoupling diode connected between the active alternating current clamp and the gate of the clamp transistor.

According to some embodiments, the active alternating current clamp comprises a second clamp transistor connected between the clamp signal input terminal and the decoupling diode, a resistor connected between the clamp signal input terminal and a gate of the second clamp transistor, and a capacitor connected between the gate of the second clamp transistor and the decoupling diode.

According to some embodiments, the clamp driver comprises a decoupling diode, a pull-up transistor connected between the bootstrap terminal and the decoupling diode, and a pull-down transistor connected between the decoupling diode and the reference voltage terminal.

According to some embodiments, the gate driver comprises a start-up circuit comprising a decoupling diode connected to the gate of the clamp transistor, a start-up transistor connected between the bootstrap terminal and the decoupling diode, a resistor connected between the bootstrap terminal and a gate of the start-up transistor, and a lockout transistor connected between the gate of the start-up transistor and the reference voltage terminal.

According to some embodiments, the gate driver comprises an electrostatic discharge protection device connected between the clamp signal input terminal and the reference voltage terminal.

According to some embodiments, the electrostatic discharge protection device comprises a Zener diode.

According to some embodiments, a circuit comprises a supply voltage terminal, a bootstrap terminal connected to the supply voltage terminal, a bootstrap capacitor connected to the bootstrap terminal, a high side transistor, a low side transistor, a high side gate driver connected to the high side transistor and having a power input terminal connected to the bootstrap terminal, a low side gate driver connected to the low side transistor, a controller configured to generate a start-up pulse using the low side gate driver to charge the bootstrap capacitor, a clamp driver, a clamp transistor connected between a gate of the high side transistor and a reference voltage terminal and having a gate connected to the clamp driver, and an energy harvesting circuit connected between the gate of the high side transistor and the gate of the clamp transistor and configured to harvest energy from the gate of the high side transistor responsive to the start-up pulse and activate the clamp transistor using the harvested energy.

According to some embodiments, the energy harvesting circuit comprises an active alternating current clamp connected to the gate of the high side transistor, and a decoupling diode connected between the active alternating current clamp and the gate of the clamp transistor.

According to some embodiments, the active alternating current clamp comprises a second clamp transistor connected between the gate of the high side transistor and the decoupling diode, a resistor connected between the gate of the high side transistor and a gate of the second clamp transistor, and a capacitor connected between the gate of the second clamp transistor and the decoupling diode.

According to some embodiments, the clamp driver comprises a decoupling diode, a pull-up transistor connected between the bootstrap terminal and the decoupling diode, and a pull-down transistor connected between the decoupling diode and the reference voltage terminal.

According to some embodiments, the circuit comprises a start-up circuit comprising a decoupling diode connected to the gate of the clamp transistor, a start-up transistor connected between the bootstrap terminal and the decoupling diode, a resistor connected between the bootstrap terminal and a gate of the start-up transistor, and a lockout transistor connected between the gate of the start-up transistor and the reference voltage terminal.

According to some embodiments, the circuit comprises an electrostatic discharge protection device connected between the gate of the high side transistor and the reference voltage terminal.

According to some embodiments, the electrostatic discharge protection device comprises a Zener diode.

According to some embodiments, a method comprises generating a start-up pulse, harvesting energy injected on a clamp signal input terminal responsive to the start-up pulse, and activating a clamp transistor connected between the clamp signal input terminal and a reference voltage terminal using the harvested energy to provide a low impedance path from the clamp signal input terminal to the reference voltage terminal.

According to some embodiments, activating the clamp transistor comprises connecting an active alternating current clamp to the clamp signal input terminal, connecting a decoupling diode between the active alternating current clamp and a gate of the clamp transistor, and inhibiting discharge of the harvested energy on the gate of the clamp transistor using the decoupling diode.

According to some embodiments, connecting the active alternating current clamp to the clamp signal input terminal comprises connecting a second clamp transistor between the clamp signal input terminal and the decoupling diode, connecting a resistor between the clamp signal input terminal and a gate of the second clamp transistor, and connecting a capacitor between the gate of the second clamp transistor and the decoupling diode, and harvesting the energy injected on the clamp signal input terminal comprises storing the harvested energy on the gate of the clamp transistor by charging the capacitor.

According to some embodiments, the method comprises connecting a clamp driver to the gate of the clamp transistor, the clamp driver comprising a second decoupling diode, a pull-up transistor connected between a bootstrap terminal connected to a supply voltage terminal and the second decoupling diode for activating the clamp transistor, and a pull-down transistor connected between the second decoupling diode and the reference voltage terminal for deactivating the clamp transistor, and inhibiting discharge of the harvested energy on the gate of the clamp transistor using the second decoupling diode.

According to some embodiments, the method comprises connecting a start-up circuit to a bootstrap voltage generated by the start-up pulse by connecting a decoupling diode to a gate of the clamp transistor, connecting a start-up transistor between a bootstrap terminal and the decoupling diode, connecting a resistor between the bootstrap terminal and a gate of the start-up transistor, and connecting a lockout transistor between the gate of the start-up transistor and the reference voltage terminal, wherein the method comprises inhibiting discharge of the harvested energy on the gate of the clamp transistor using the decoupling diode.

According to some embodiments, the method comprises connecting an electrostatic discharge protection device between the clamp signal input terminal and the reference voltage terminal.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

Moreover, "exemplary" and/or the like is used herein to mean serving as an example, instance, illustration, etc., and not necessarily as advantageous. Rather, use of the word "example" and/or the like is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A gate driver, comprising:
   a supply voltage terminal;
   a bootstrap terminal connected to the supply voltage terminal;
   a driver having a power input terminal connected to the bootstrap terminal and an output connected to a gate control signal output terminal and configured to generate a gate drive signal at the gate control signal output terminal based on a voltage on the power input terminal;
   a clamp driver connected to the bootstrap terminal;
   a clamp transistor connected between a clamp signal input terminal and a reference voltage terminal and having a gate connected to the clamp driver; and
   an energy harvesting circuit connected between the clamp signal input terminal and the gate of the clamp transistor.

2. The gate driver of claim 1, wherein the energy harvesting circuit comprises:
   an active alternating current clamp connected to the clamp signal input terminal; and
   a decoupling diode connected between the active alternating current clamp and the gate of the clamp transistor.

3. The gate driver of claim 2, wherein the active alternating current clamp comprises:
   a second clamp transistor connected between the clamp signal input terminal and the decoupling diode;
   a resistor connected between the clamp signal input terminal and a gate of the second clamp transistor; and
   a capacitor connected between the gate of the second clamp transistor and the decoupling diode.

4. The gate driver of claim 1, wherein the clamp driver comprises:
   a decoupling diode;
   a pull-up transistor connected between the bootstrap terminal and the decoupling diode; and
   a pull-down transistor connected between the decoupling diode and the reference voltage terminal.

5. The gate driver of claim 1, comprising:
   a start-up circuit, comprising:
      a decoupling diode connected to the gate of the clamp transistor;
      a start-up transistor connected between the bootstrap terminal and the decoupling diode;
      a resistor connected between the bootstrap terminal and a gate of the start-up transistor; and
      a lockout transistor connected between the gate of the start-up transistor and the reference voltage terminal.

6. The gate driver of claim 1, comprising:
an electrostatic discharge protection device connected between the clamp signal input terminal and the reference voltage terminal.

7. The gate driver of claim 6, wherein:
the electrostatic discharge protection device comprises a Zener diode.

8. A circuit, comprising:
a supply voltage terminal;
a bootstrap terminal connected to the supply voltage terminal;
a bootstrap capacitor connected to the bootstrap terminal;
a high side transistor;
a low side transistor;
a high side gate driver connected to the high side transistor and having a power input terminal connected to the bootstrap terminal;
a low side gate driver connected to the low side transistor;
a controller configured to generate a start-up pulse using the low side gate driver to charge the bootstrap capacitor;
a clamp driver;
a clamp transistor connected between a gate of the high side transistor and a reference voltage terminal and having a gate connected to the clamp driver; and
an energy harvesting circuit connected between the gate of the high side transistor and the gate of the clamp transistor and configured to harvest energy from the gate of the high side transistor responsive to the start-up pulse and activate the clamp transistor using the harvested energy.

9. The circuit of claim 8, wherein the energy harvesting circuit comprises:
an active alternating current clamp connected to the gate of the high side transistor; and
a decoupling diode connected between the active alternating current clamp and the gate of the clamp transistor.

10. The circuit of claim 9, wherein the active alternating current clamp comprises:
a second clamp transistor connected between the gate of the high side transistor and the decoupling diode;
a resistor connected between the gate of the high side transistor and a gate of the second clamp transistor; and
a capacitor connected between the gate of the second clamp transistor and the decoupling diode.

11. The circuit of claim 8, wherein the clamp driver comprises:
a decoupling diode;
a pull-up transistor connected between the bootstrap terminal and the decoupling diode; and
a pull-down transistor connected between the decoupling diode and the reference voltage terminal.

12. The circuit of claim 8, comprising:
a start-up circuit, comprising:
a decoupling diode connected to the gate of the clamp transistor;
a start-up transistor connected between the bootstrap terminal and the decoupling diode;
a resistor connected between the bootstrap terminal and a gate of the start-up transistor; and
a lockout transistor connected between the gate of the start-up transistor and the reference voltage terminal.

13. The circuit of claim 8, comprising:
an electrostatic discharge protection device connected between the gate of the high side transistor and the reference voltage terminal.

14. The circuit of claim 13, wherein:
the electrostatic discharge protection device comprises a Zener diode.

15. A method, comprising:
generating a start-up pulse;
harvesting energy injected on a clamp signal input terminal responsive to the start-up pulse; and
activating a clamp transistor connected between the clamp signal input terminal and a reference voltage terminal using the harvested energy to provide a low impedance path from the clamp signal input terminal to the reference voltage terminal.

16. The method of claim 15, wherein activating the clamp transistor comprises:
connecting an active alternating current clamp to the clamp signal input terminal;
connecting a decoupling diode between the active alternating current clamp and a gate of the clamp transistor; and
inhibiting discharge of the harvested energy on the gate of the clamp transistor using the decoupling diode.

17. The method of claim 16, wherein:
connecting the active alternating current clamp to the clamp signal input terminal comprises:
connecting a second clamp transistor between the clamp signal input terminal and the decoupling diode;
connecting a resistor between the clamp signal input terminal and a gate of the second clamp transistor; and
connecting a capacitor between the gate of the second clamp transistor and the decoupling diode; and
harvesting the energy injected on the clamp signal input terminal comprises:
storing the harvested energy on the gate of the clamp transistor by charging the capacitor.

18. The method of claim 16, comprising:
connecting a clamp driver to the gate of the clamp transistor, the clamp driver comprising:
a second decoupling diode;
a pull-up transistor connected between a bootstrap terminal connected to a supply voltage terminal and the second decoupling diode for activating the clamp transistor; and
a pull-down transistor connected between the second decoupling diode and the reference voltage terminal for deactivating the clamp transistor; and
inhibiting discharge of the harvested energy on the gate of the clamp transistor using the second decoupling diode.

19. The method of claim 15, comprising:
connecting a start-up circuit to a bootstrap voltage generated by the start-up pulse by:
connecting a decoupling diode to a gate of the clamp transistor;
connecting a start-up transistor between a bootstrap terminal and the decoupling diode;
connecting a resistor between the bootstrap terminal and a gate of the start-up transistor; and
connecting a lockout transistor between the gate of the start-up transistor and the reference voltage terminal,
wherein:
the method comprises:
inhibiting discharge of the harvested energy on the gate of the clamp transistor using the decoupling diode.

20. The method of claim 15, comprising:
   connecting an electrostatic discharge protection device between the clamp signal input terminal and the reference voltage terminal.

\* \* \* \* \*